United States Patent
Voldman

(10) Patent No.: US 8,143,671 B2
(45) Date of Patent: Mar. 27, 2012

(54) LATERAL TRENCH FETS (FIELD EFFECT TRANSISTORS)

(75) Inventor: Steven Howard Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 270 days.

(21) Appl. No.: 12/640,192

(22) Filed: Dec. 17, 2009

(65) Prior Publication Data

US 2010/0090277 A1 Apr. 15, 2010

Related U.S. Application Data

(62) Division of application No. 11/778,428, filed on Jul. 16, 2007, now abandoned.

(51) Int. Cl.
*H01L 21/8238* (2006.01)
(52) U.S. Cl. .................. 257/343; 438/204
(58) Field of Classification Search .................. 438/197, 438/204, 206, 270–272, 514, 527, 529; 257/335, 257/337, 343, 355, 357
See application file for complete search history.

(56) References Cited

U.S. PATENT DOCUMENTS

| | | | |
|---|---|---|---|
| 5,656,843 A | 8/1997 | Goodyear et al. | |
| 5,723,891 A | 3/1998 | Malhi | |
| 6,046,470 A | 4/2000 | Williams et al. | |
| 6,211,018 B1 | 4/2001 | Nam et al. | |
| 6,621,121 B2 | 9/2003 | Baliga | |
| 6,627,950 B1 | 9/2003 | Bulucea et al. | |
| 6,638,825 B2 | 10/2003 | Lee | |
| 6,781,194 B2 | 8/2004 | Baliga | |
| 6,800,904 B2 | 10/2004 | Fujishima et al. | |
| 6,844,578 B2 * | 1/2005 | Harada et al. | 257/278 |
| 6,858,500 B2 * | 2/2005 | Sugi et al. | 438/270 |
| 6,921,942 B2 | 7/2005 | Murakami | |
| 7,135,738 B2 | 11/2006 | Williams et al. | |
| 7,256,086 B2 * | 8/2007 | Tabuchi et al. | 438/206 |
| 2004/0075138 A1 * | 4/2004 | Fujishima et al. | 257/343 |
| 2004/0152273 A1 | 8/2004 | Kim | |
| 2007/0252731 A1 | 11/2007 | Chung | |

OTHER PUBLICATIONS

Notice of Allowance (Mail Date Oct. 6, 2009) for U.S. Appl. No. 11/778,428, filed Jul. 16, 2007; First Named Inventor: Steven Howard Voldman; Confirmation No. 1411.

* cited by examiner

*Primary Examiner* — Kiesha Bryant
*Assistant Examiner* — Mark Tornow
(74) *Attorney, Agent, or Firm* — Schmeiser, Olsen & Watts; Anthony Canale

(57) ABSTRACT

A semiconductor structure and associated method of formation. The semiconductor structure includes a semiconductor substrate, a first doped transistor region of a first transistor and a first doped Source/Drain portion of a second transistor on the semiconductor substrate, a second gate dielectric layer and a second gate electrode region of the second transistor on the semiconductor substrate, a first gate dielectric layer and a first gate electrode region of the first transistor on the semiconductor substrate, and a second doped transistor region of the first transistor and a second doped Source/Drain portion of the second transistor on the semiconductor substrate. The first and second gate dielectric layers are sandwiched between and electrically insulate the semiconductor substrate from the first and second gate electrode regions, respectively. The first and second gate electrode regions are totally above and totally below, respectively, the top substrate surface.

20 Claims, 9 Drawing Sheets

LATERAL TRENCH FETS (FIELD EFFECT TRANSISTORS)

This application is a divisional application claiming priority to Ser. No. 11/778,428, filed Jul. 16, 2007.

FIELD OF THE INVENTION

The present invention relates generally to lateral trench FETs (Field Effect Transistors) and more particularly to formation of the lateral trench FETs using step of LDMOS (Lateral double-Diffused Metal Oxide Semiconductor) technology.

BACKGROUND OF THE INVENTION

In semiconductor technology, there is a need for LDMOS (Lateral double-Diffused Metal Oxide Semiconductor) and high voltage power devices on the same wafer. Therefore, there is a need for a method for forming the LDMOS and the high voltage power devices on the same wafer that requires fewer steps than in the prior art.

SUMMARY OF THE INVENTION

The present invention provides a semiconductor structure, comprising (a) a semiconductor substrate which includes a top substrate surface which defines a reference direction perpendicular to the top substrate surface; (b) a first transistor on the semiconductor substrate; and (c) a second transistor on the semiconductor substrate, wherein a first doping profile of a first doped transistor region of the first transistor in the reference direction and a second doping profile of a first doped Source/Drain portion of the second transistor in the reference direction are essentially the same, wherein the first doped transistor region is not a portion of a Source/Drain region of the first transistor, wherein a first gate electrode region of the first transistor is on a first side of the top substrate surface, wherein a second gate electrode region of the second transistor is on a second side of the top substrate surface, and wherein the first side and the second side are opposite sides of the top substrate surface.

The present invention provides a method for forming the LDMOS and the high voltage power devices on the same wafer that requires fewer steps than in the prior art.

DETAILED DESCRIPTION OF THE INVENTION

FIGS. 1A-1H show cross-section views used to illustrate a fabrication process of a semiconductor structure 100, in accordance with embodiments of the present invention. More specifically, with reference to FIG. 1A, the fabrication process of the semiconductor structure 100 starts with a P− substrate 110. The P− substrate 110 comprises silicon doped with p-type dopants (e.g., boron atoms). Next, a deep trench 111 is formed in the P− substrate 110. The deep trench 111 can be formed by a conventional method.

Figure 1A:
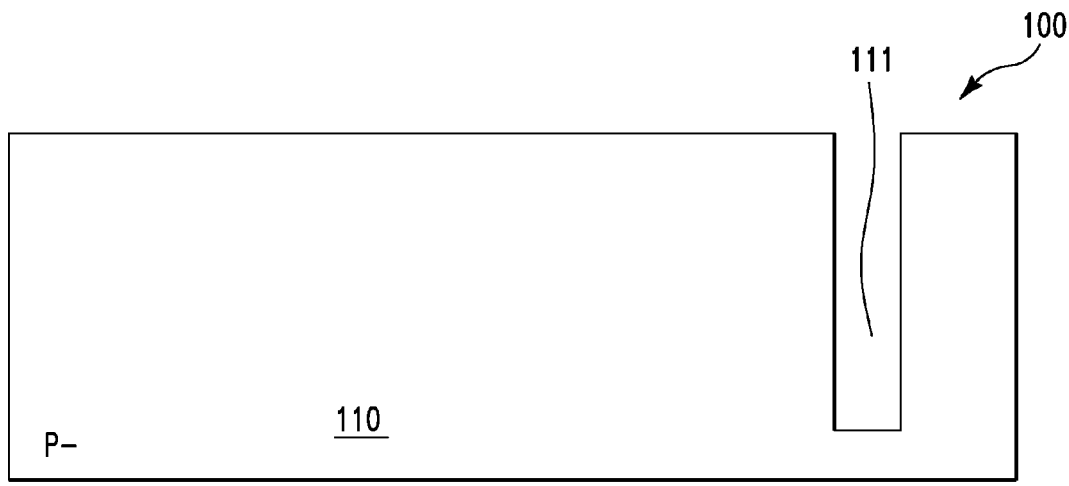
FIGS. 1A-1H show cross-section views used to illustrate a fabrication process of a first semiconductor structure, in accordance with embodiments of the present invention.
Figure 1B:
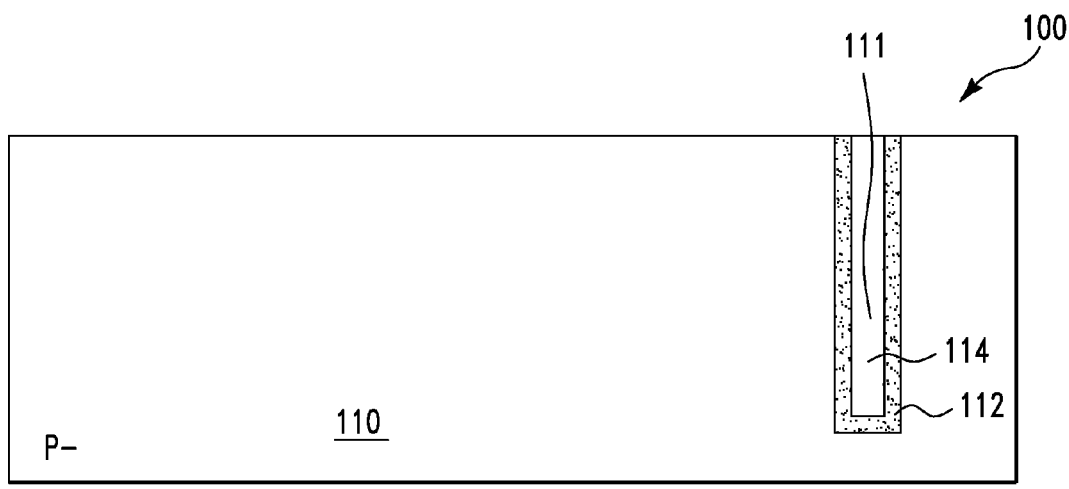

Next, with reference to FIG. 1B, in one embodiment, a dielectric layer 112 and a poly-silicon region 114 are formed in the deep trench 111. The dielectric layer 112 can comprise silicon dioxide. The dielectric layer 112 and the poly-silicon region 114 can be formed by (i) depositing a dielectric layer on top of the semiconductor structure 100 of FIG. 1A, (ii) depositing a poly-silicon layer on top of the dielectric layer such that the deep trench 111 is filled with poly-silicon, and then (iii) removing portions of the dielectric layer and the poly-silicon layer outside the deep trench 111 resulting in the dielectric layer 112 and the poly-silicon region 114. It should be noted that the dielectric layer 112 and the poly-silicon region 114 can be collectively referred to as a deep trench isolation region 112+114.

Figure 1C:
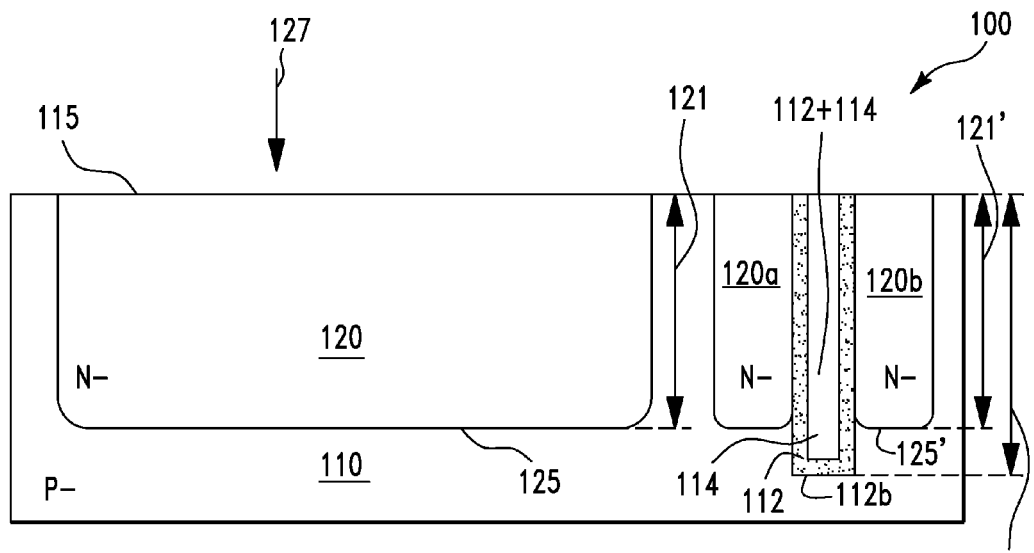

Next, with reference to FIG. 1C, in one embodiment, N− regions 120, 120*a*, and 120*b* are formed in the P-substrate 110. The N− regions 120, 120*a*, and 120*b* can comprise n-type dopants (e.g., arsenic atoms). The N− regions 120, 120*a*, and 120*b* can be formed by (i) forming a photoresist layer (not shown) on top of the structure 100 of FIG. 1B, (ii) patterning the photoresist layer, and (iii) ion implanting n-type dopants by an ion implantation process into the semiconductor structure 100 with the patterned photoresist layer as a blocking mask resulting in the N− regions 120, 120*a*, and 120*b*. After that, the patterned photoresist layer is removed resulting in the structure 100 of FIG. 1C.

As a result of the N− region 120 and the N− regions 120*a* and 120*b* being formed by the same ion implantation process, a depth 121 of the N− region 120 and a depth 121' of the N− regions 120*a* and 120*b* are equal. The depth 121 of the N− region 120 is the vertical distance from the top surface 115 of the substrate 110 to the bottom surface 125 of the N− region 120. The depth 121' of the N− regions 120*a* and 120*b* is a vertical distance from the top surface 115 of the substrate 110 to the bottom surface 125' of the N− region 120*b*. Similarly, a depth 112' of the deep trench isolation region 112+114 is a vertical distance from the top surface 115 of the substrate 110 to the bottom surface 112*b* of the dielectric layer 112 (the depth 112' is also considered the depth 112' of the dielectric layer 112). In one embodiment, the depth 112' is greater than the depth 121. In one embodiment, for illustration, the depth 112' is also considered the depth of the poly-silicon region 114.

Also as a result of the N− region 120 and the N− regions 120*a* and 120*b* being formed by the same ion implantation process, doping concentrations with respect to the depth (i.e., in the reference direction 127 which is perpendicular to the top surface 115 of the substrate 110) in the N− region 120 and the N− regions 120*a* and 120*b* have the same doping profile. The doping profile of the N− region 120 is the dopant concentration of the N− region 120 distributed along the depth 121 of the N− region 120. The doping profiles of the N− regions 120*a* and 120*b* are the dopant concentrations of the N− regions 120*a* and 120*b* distributed along the depth 121' of the N− regions 120*a* and 120*b*.

Figure 1D:
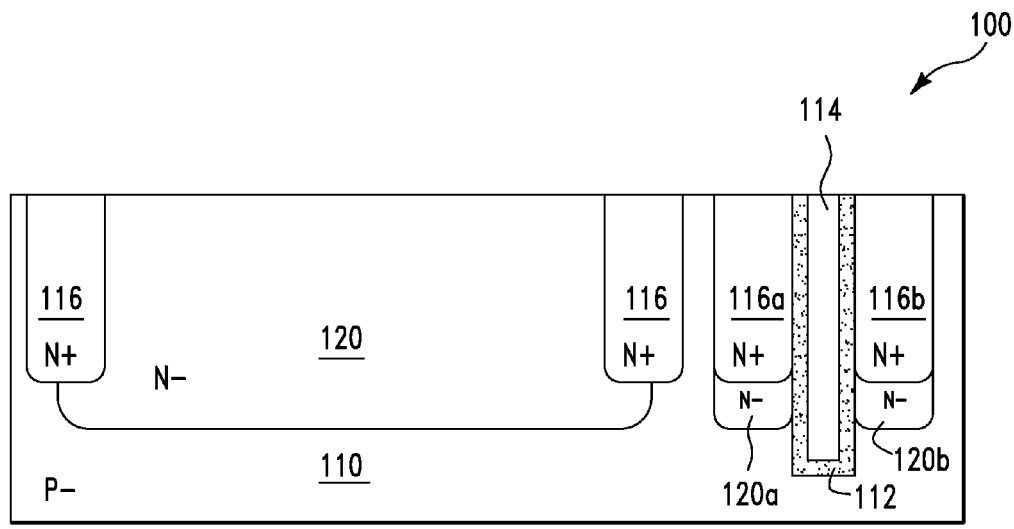

Next, with reference to FIG. 1D, in one embodiment, N+ regions 116, 116a, and 116b are formed in the P− substrate 110. The N+ regions 116, 116a, and 116b can comprise n-type dopants. The N+ regions 116, 116a, 116b can be formed by (i) forming a photoresist layer (not shown) on top of the structure 100 of FIG. 1B, (ii) patterning the photoresist layer, and (iii) ion implanting n-type dopants by an ion implantation process into the semiconductor structure 100 with the patterned photoresist layer as a blocking mask resulting in the N+ regions 116, 116a, and 116b. After that, the patterned photoresist layer is removed resulting in the structure 100 of FIG. 1D. The N+ regions 116, 116a, and 116b are heavily doped such that the dopant concentration of the N+ regions 116, 116a, and 116b is higher than the dopant concentration of the N− regions 120, 120a, and 120b.

Figure 1E:
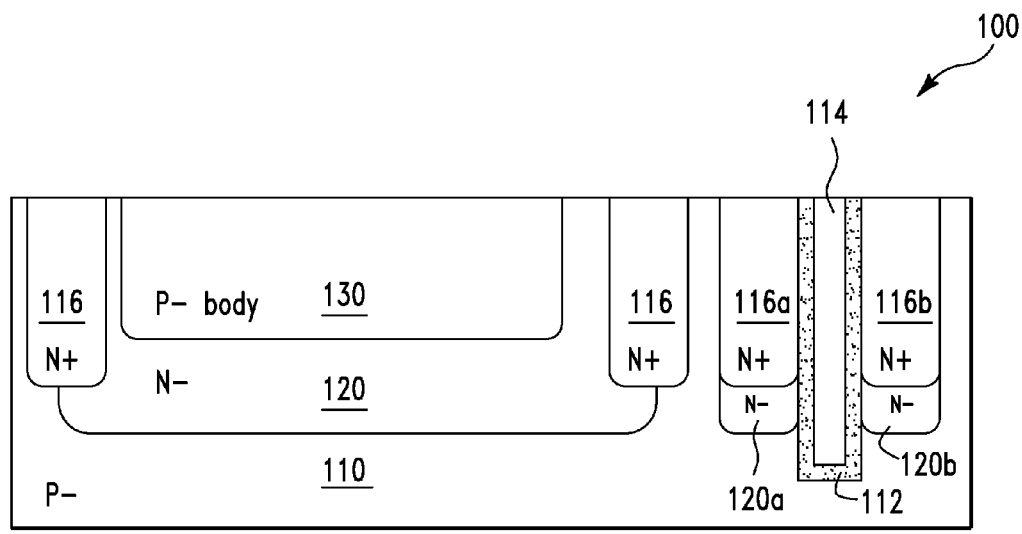

Next, with reference to FIG. 1E, in one embodiment, a P− body region 130 is formed in the N− region 120. The P− body region 130 comprises p-type dopants. The P− body region 130 can be formed in a manner similar to the manner in which the N− region 120 of FIG. 1C is formed (i.e., selective ion implantation).

Figure 1F:
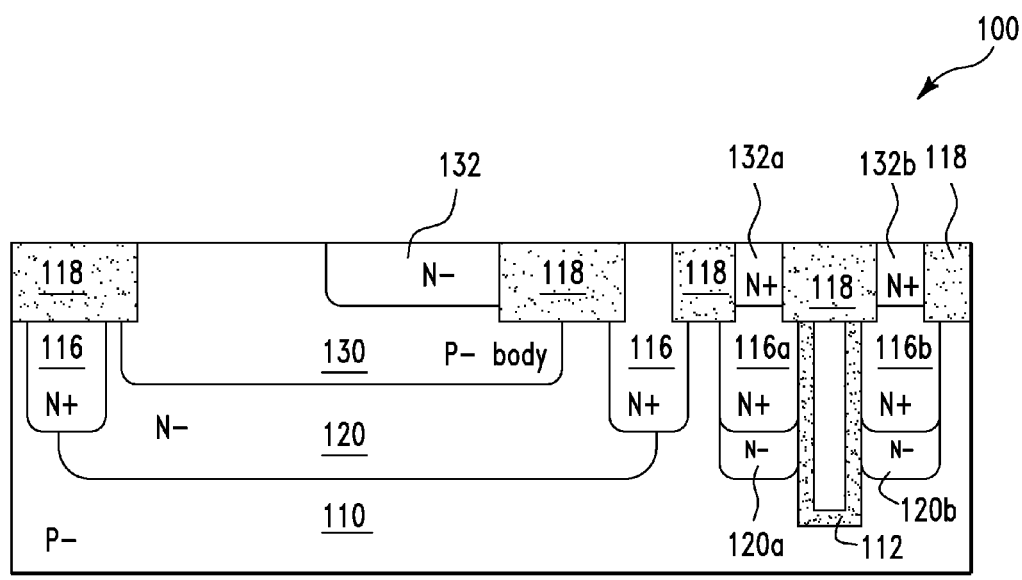

Next, with reference to FIG. 1F, in one embodiment, STI (shallow trench isolation) regions 118 are formed in the P− substrate 110. The STI regions 118 can comprise silicon dioxide. The STI regions 118 can be formed by (i) forming a photoresist layer (not shown) on top of the structure 100 of FIG. 1E, (ii) patterning the photoresist layer, (iii) anisotropically etching the semiconductor structure 100 using the patterned photoresist layer as a blocking mask resulting in shallow trenches 118, and then (iv) filling back the shallow trenches with silicon dioxide resulting in the STI regions 118.

Next, an N− region 132 is foamed in the P− body region 130. The N− region 132 comprises n-type dopants. The N− region 132 can be formed by a selective ion implantation process. In one embodiment, the ion implantation process that forms the N− regions 132 also implants n-type dopants into the N+ regions 116a and 116b resulting in N+ regions 132a and 132b. As a result, the N+ regions 132a and 132b comprise n-type dopants from two separate ion implantation processes that form the N− region 132 and the N+ regions 116a and 116b.

Figure 1G:
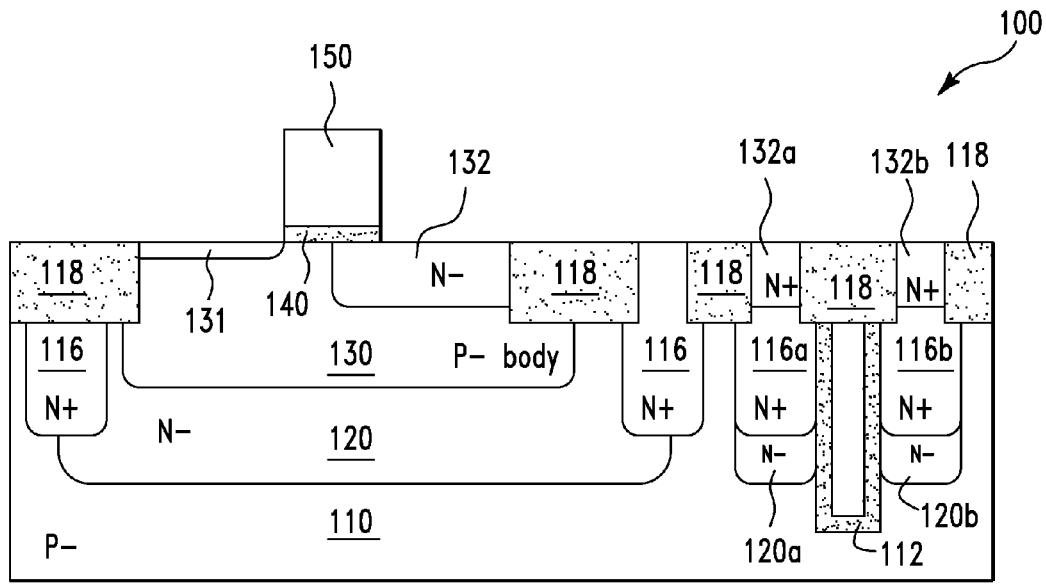

Next, with reference to FIG. 1G, in one embodiment, a gate dielectric region 140 and a gate electrode region 150 are formed on top of the P− body region 130. The gate dielectric region 140 can comprise silicon dioxide. The gate electrode region 150 can comprise poly-silicon. The gate dielectric region 140 and the gate electrode region 150 can be formed by a conventional method.

Next, in one embodiment, an extension region 131 is formed in the P− body region 130. The extension region 131 comprises n-type dopants. The extension region 131 can be formed by a conventional method.

Figure 1H:
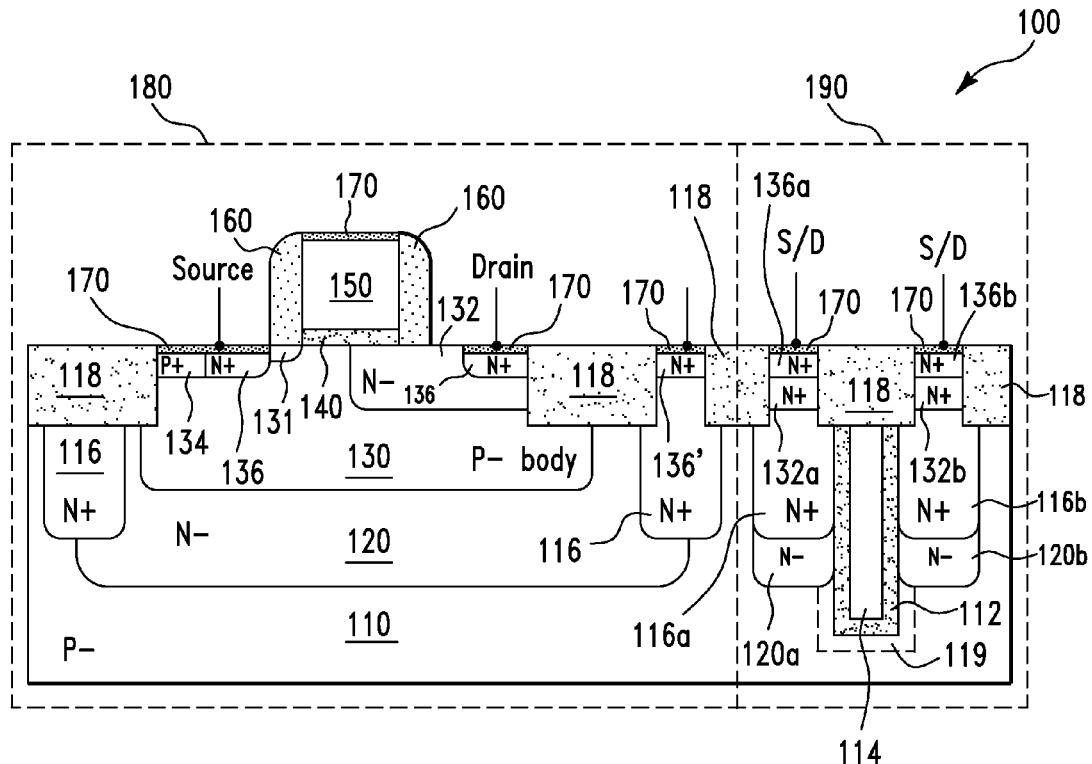

Next, with reference to FIG. 1H, in one embodiment, spacer regions 160 are formed on side walls of the gate dielectric region 140 and the gate electrode region 150. The spacer regions 160 can comprise silicon nitride. The spacer regions 160 can be formed by a conventional method.

Next, in one embodiment, a P+ region 134, N+ regions 136, 136', 136a, and 136b are formed in the semiconductor structure 100. The P+ region 134 comprises p-type dopants. The N+ regions 136, 136', 136a, and 136b comprise n-type dopants. The P+ region 134 and the N+ regions 136, 136', 136a, and 136b can be formed by a conventional method. More specifically, in one embodiment, the N+ regions 136, 136', 136a, and 136b can be formed by an ion implantation process.

Next, in one embodiment, silicide regions 170 are formed on the P+ region 134 and the N+ regions 136, 136', 136a, and 136b. The silicide regions 170 can be formed by a conventional method.

Next, in one embodiment, a dielectric layer (not shown) is formed on top of the structure 100 of FIG. 1H. Then, contact regions (not shown) are formed in the dielectric layer to provide electrical access to the silicide regions 170.

It should be noted that a structure 180 of the semiconductor structure 100 of FIG. 1H is an LDMOS (Lateral double-Diffused Metal Oxide Semiconductor) transistor 180, whereas a structure 190 of FIG. 1H serves as a lateral trench FET (Field Effect Transistor) 190. The lateral trench FET 190 includes a channel region 119, a first Source/Drain region 120a+116a+132a+136a, a second Source/Drain region 120b+116b+132b+136b, a gate dielectric layer 112, and a gate electrode region 114. When the lateral trench FET 190 is on, there is an electric current flowing between the first and second Source/Drain regions through the channel region 119.

It should be noted that regions of the lateral trench FET 190 (except the gate dielectric layer 112 and the gate electrode region 114) are formed using steps in the fabrication process of the LDMOS transistor 180. The lateral trench FET 190 can serve as a high voltage power device that has a breakdown voltage in the range from 120V to 150V.

Figure 2A:
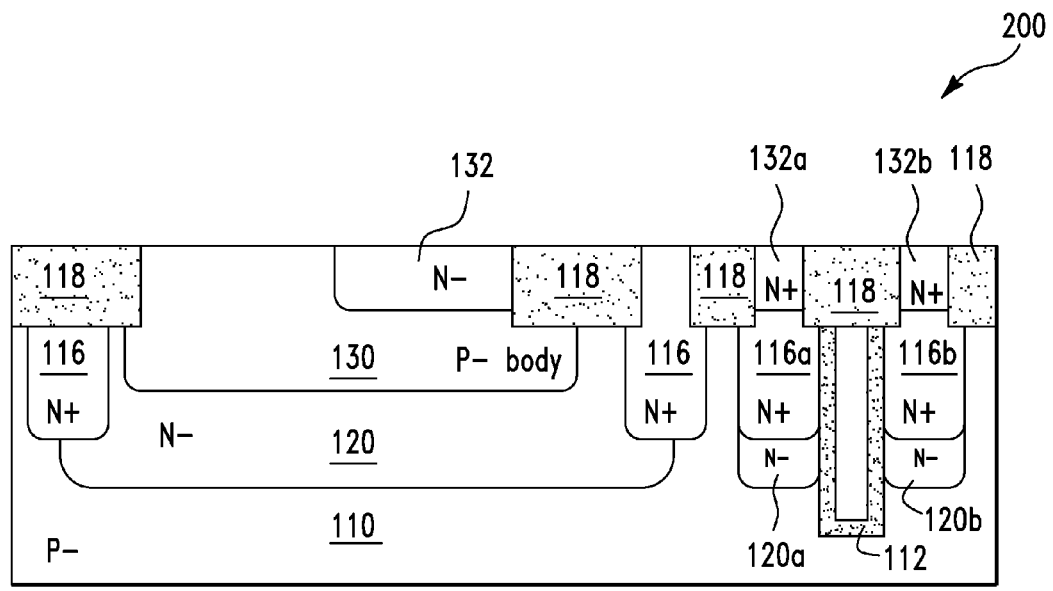
FIGS. 2A-2D show cross-section views used to illustrate a fabrication process of a second semiconductor structure, in accordance with embodiments of the present invention.

FIGS. 2A-2D show cross-section views used to illustrate a fabrication process of a semiconductor structure 200, in accordance with embodiments of the present invention. More specifically, with reference to FIG. 2A, the fabrication process of the semiconductor structure 200 starts with the semiconductor structure 200 of FIG. 2A. The semiconductor structure 200 of FIG. 2A is similar to the semiconductor structure 100 of FIG. 1F. The formation of the structure 200 of FIG. 2A is similar to the formation of the structure 100 of FIG. 1F.

Figure 2B:
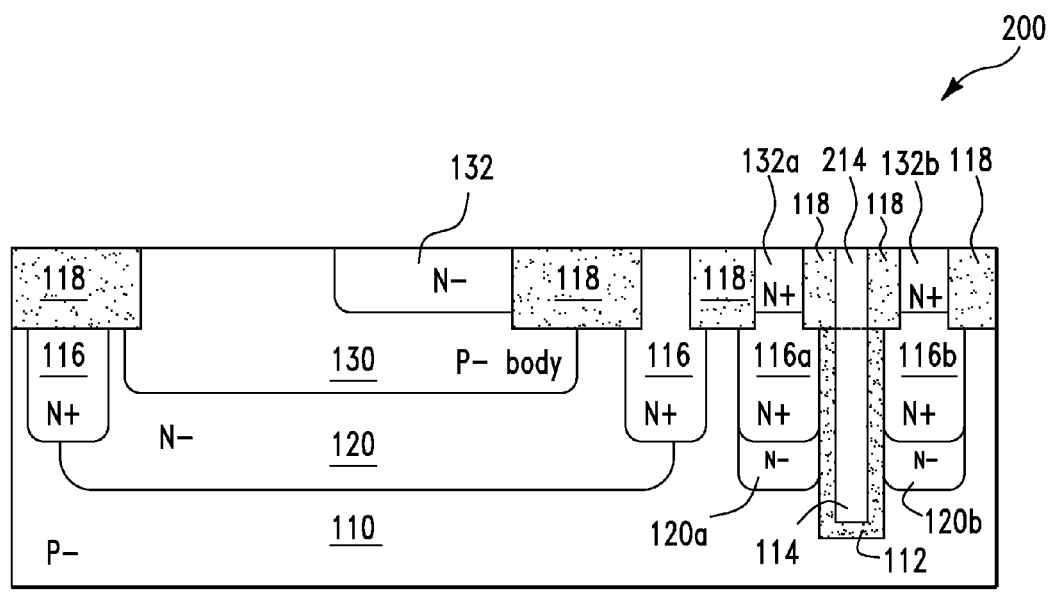

Next, with reference to FIG. 2B, in one embodiment, a poly-silicon region 214 is formed in the STI region 118 such that the poly-silicon region 214 and the poly-silicon region 114 constitute a poly-silicon region 214+114. The poly-silicon region 214 can be formed by a conventional method.

Figure 2C:
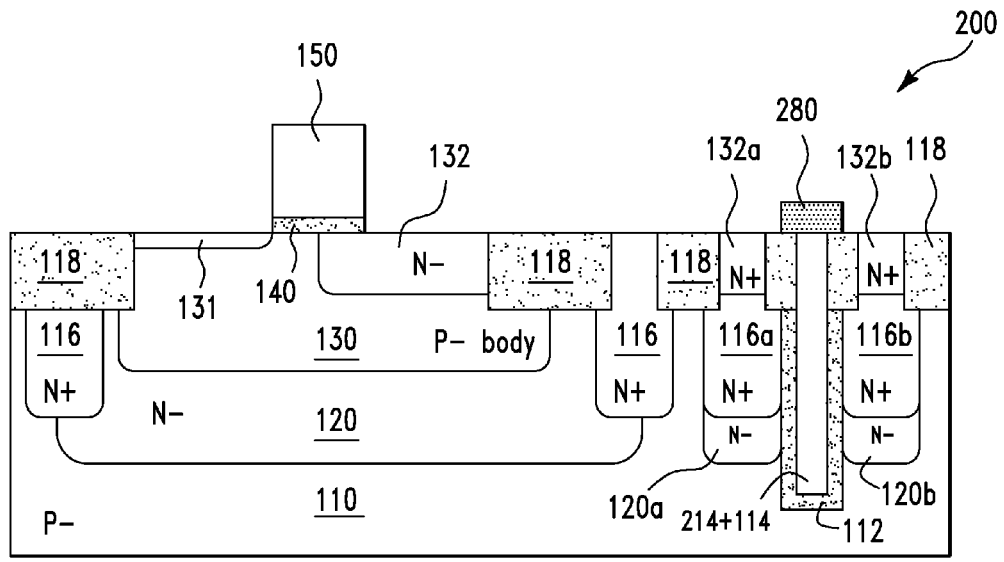

Next, with reference to FIG. 2C, in one embodiment, a silicon germanium region 280 is formed on top of and in direct physical contact with the poly-silicon region 214+114. The silicon germanium region 280 can be formed by selective epitaxial growth.

Next, in one embodiment, the gate dielectric region 140, the gate electrode region 150, and the extension region 131 are formed on the P− body region 130. The gate dielectric region 140, the gate electrode region 150, and the extension region 131 can be formed in a manner similar to the manner in which the gate dielectric region 140, the gate electrode region 150, and the extension region 131 of FIG. 1G are formed.

Figure 2D:
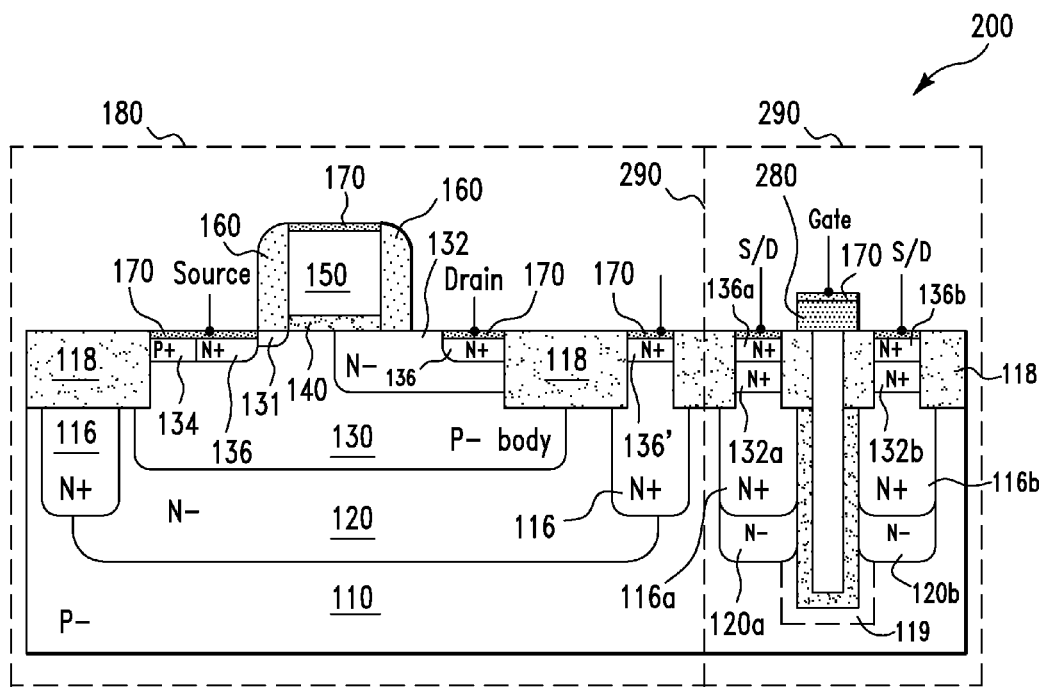

Next, with reference to FIG. 2D, in one embodiment, the spacer regions 160, the P+ region 134, and the N+ regions 136, 136', 136a, and 136b are formed on the structure 200 of FIG. 2C. The spacer regions 160, the P+ region 134, the N+ regions 136, 136', 136a, and 136b, and silicide regions 170 can be formed in a manner similar to the manner in which these regions are formed in FIG. 1H.

Next, in one embodiment, silicide regions 170 are formed on the P+ region 134, the N+ regions 136, 136', 136a, and 136b, and the silicon germanium region 280. The silicide regions 170 can be formed by a conventional method.

It should be noted that a structure 290 of the semiconductor structure 200 of FIG. 2D serve as a lateral trench FET 290. With reference to FIGS. 1H and 2D, the lateral trench FET 290 is similar to the lateral trench FET 190 of FIG. 1H except that the lateral trench 290 further comprises the silicon germanium region 280 which is electrically coupled to the poly-silicon region 214+114. The poly-silicon region 214+114 and the silicon germanium region 280 collectively serve as a gate electrode of the lateral trench FET 290.

Figure 3A:
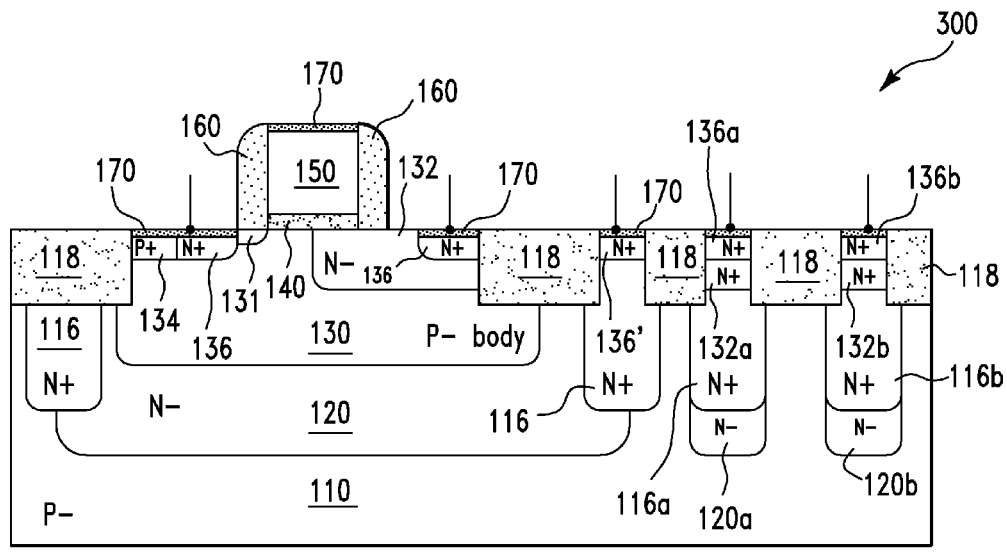
FIGS. 3A-3B show cross-section views used to illustrate a fabrication process of a third semiconductor structure, in accordance with embodiments of the present invention.
Figure 3B:
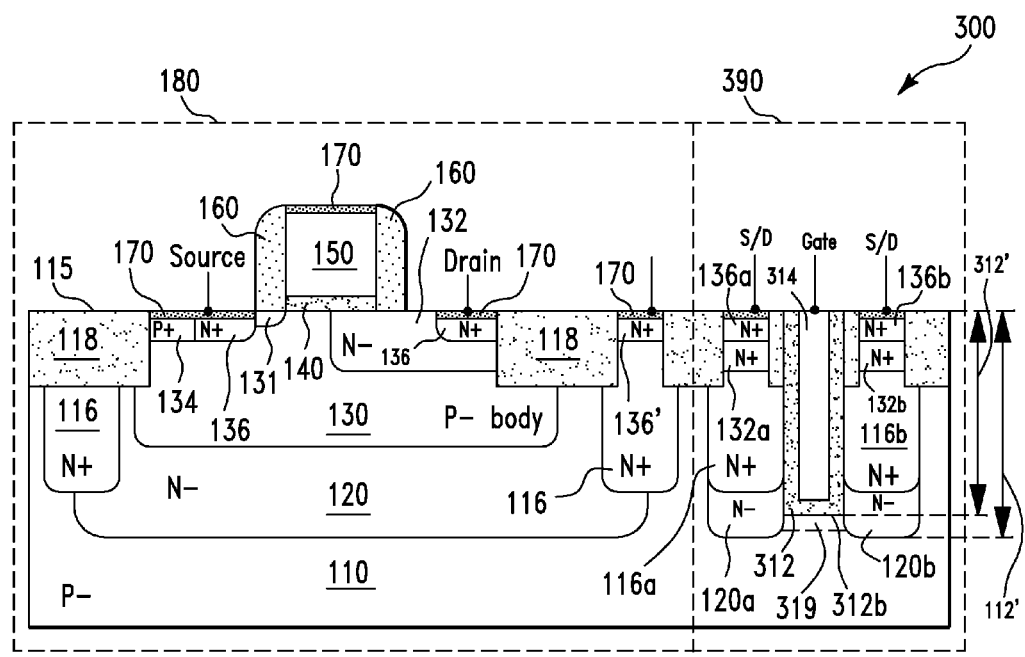

FIGS. 3A-3B show cross-section views used to illustrate a fabrication process of a semiconductor structure 300, in accordance with embodiments of the present invention. More specifically, with reference to FIG. 3A, the fabrication process of the semiconductor structure 300 starts with the semiconductor structure 300 of FIG. 3A. The structure 300 of FIG. 3A is similar to the structure 100 of FIG. 1H except that the structure 300 do not comprise the deep trench isolation region 112+114. The formation of the structure 300 of FIG. 3A is similar to the formation of the structure 100 of FIG. 1H except that the formation of the structure 300 do not comprise the formation of the deep trench isolation region 112+114.

Next, with reference to FIG. 3B, in one embodiment, a trench isolation region 312+314 is formed in the P− substrate 110. The trench isolation region 312+314 can be formed by a conventional method. A depth 312' of the trench isolation region 312+314 is a vertical distance from the top surface 115 of the substrate 110 to the bottom surface 312b of the dielectric layer 312 (the depth 312' is also considered the depth 312' of the dielectric layer 312). In one embodiment, the depth 312' is less than the depth 112'. In one embodiment, for illustration, the depth 312' is also considered the depth of the poly-silicon region 114.

It should be noted that a structure 390 of the semiconductor structure 300 of FIG. 3B serve as a lateral trench FET 390. The lateral trench FET 390 includes a channel region 319, a first Source/Drain region 120a+116a+132a+136a, a second Source/Drain region 120b+116b+132b+136b, a gate dielectric layer 312, and a gate electrode region 314. When the lateral trench FET 390 is on, there is an electric current flowing between the first and second Source/Drain regions through the channel region 319.

Figure 4:
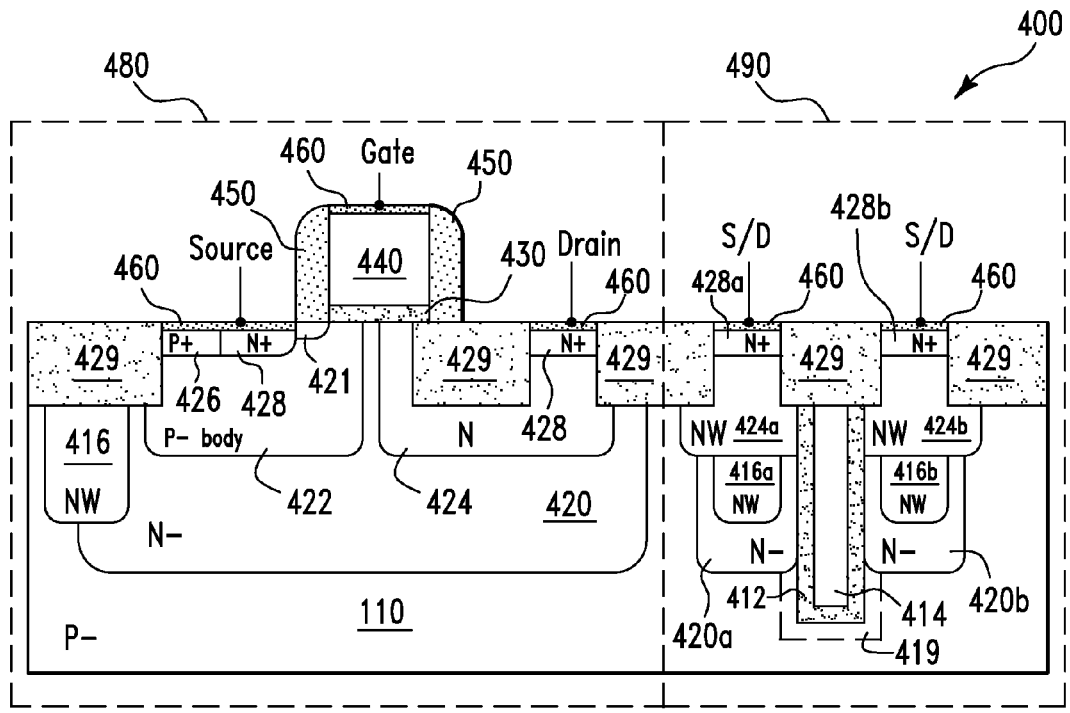
FIG. 4 shows a cross-section view of a fourth semiconductor structure, in accordance with embodiments of the present invention.

FIG. 4 shows a cross-section view of a semiconductor structure 400, in accordance with embodiments of the present invention. More specifically, the semiconductor structure 400 comprises an LDMOS transistor 480 and a lateral trench FET 490. The lateral trench FET 490 includes a channel region 419, a first Source/Drain region 420a+416a+424a+428a, a second Source/Drain region 420b+416b+424b+428b, a gate dielectric layer 412, and a gate electrode region 414. When the lateral trench FET 490 is on, there is an electric current flowing between the first and second Source/Drain regions through the channel region 419.

In one embodiment, the LDMOS transistor 480 is formed by a conventional method. In one embodiment, the first and second Source/Drain regions 420a+416a+424a+428a and 420b+416b+424b+428b of the lateral trench FET 490 are formed using steps in the fabrication process of the LDMOS transistor 480. The formation of a deep trench isolation region 412+414 is similar to the formation of the deep trench isolation region 112+114 of FIG. 1H. More specifically, the deep trench isolation region 412+414 is formed before the LDMOS transistor 480, the first and second Source/Drain regions 420a+416a+424a+428a and 420b+416b+424b+428b of the lateral trench FET 490, and the STI regions 429 are formed.

Figure 5:
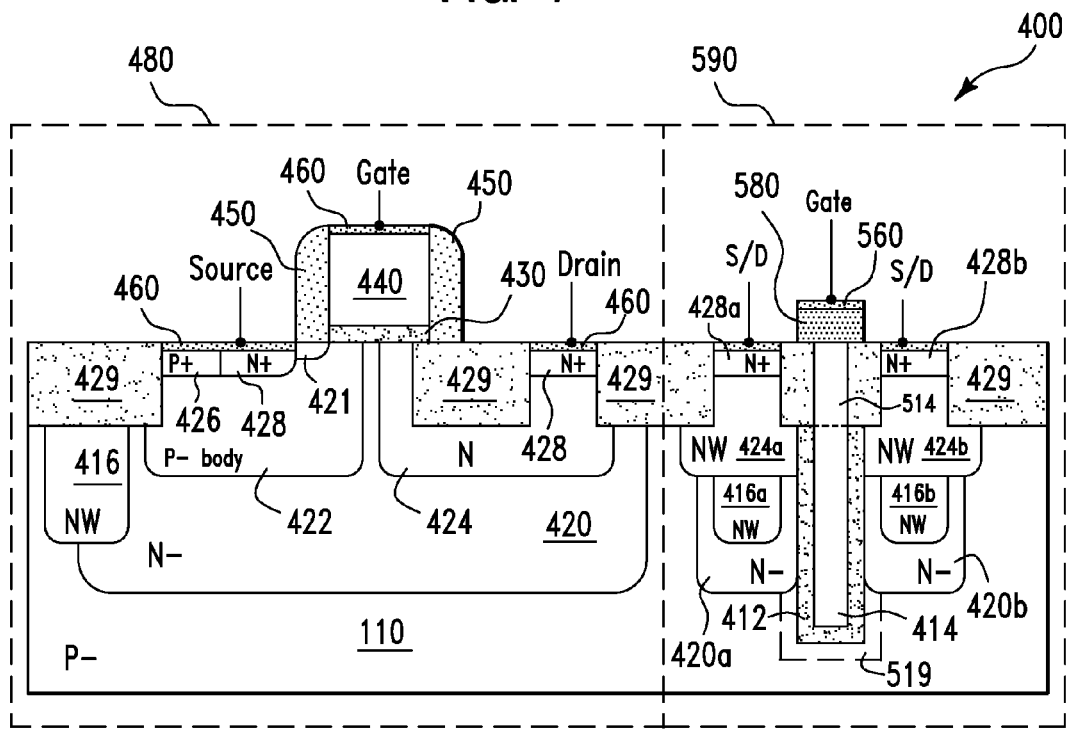
FIG. 5 shows a cross-section view of a fifth semiconductor structure, in accordance with embodiments of the present invention.

With reference to FIG. 5, in one embodiment, a poly-silicon region 514, a silicon germanium region 580, and a silicide region 560 are formed on the structure 400 of FIG. 4 resulting in the semiconductor structure 400 of FIG. 5. The poly-silicon region 514, the silicon germanium region 580, and a silicide region 560 can be formed by a conventional method. A lateral trench FET 590 of FIG. 5 is similar to the lateral trench FET 490 of FIG. 4 except that the lateral trench FET 590 comprises the poly-silicon region 514 and the silicon germanium region 580. The poly-silicon regions 514 and 414 and the silicon germanium region 580 collectively serve as a gate electrode region 514+414+580.

Figure 6:
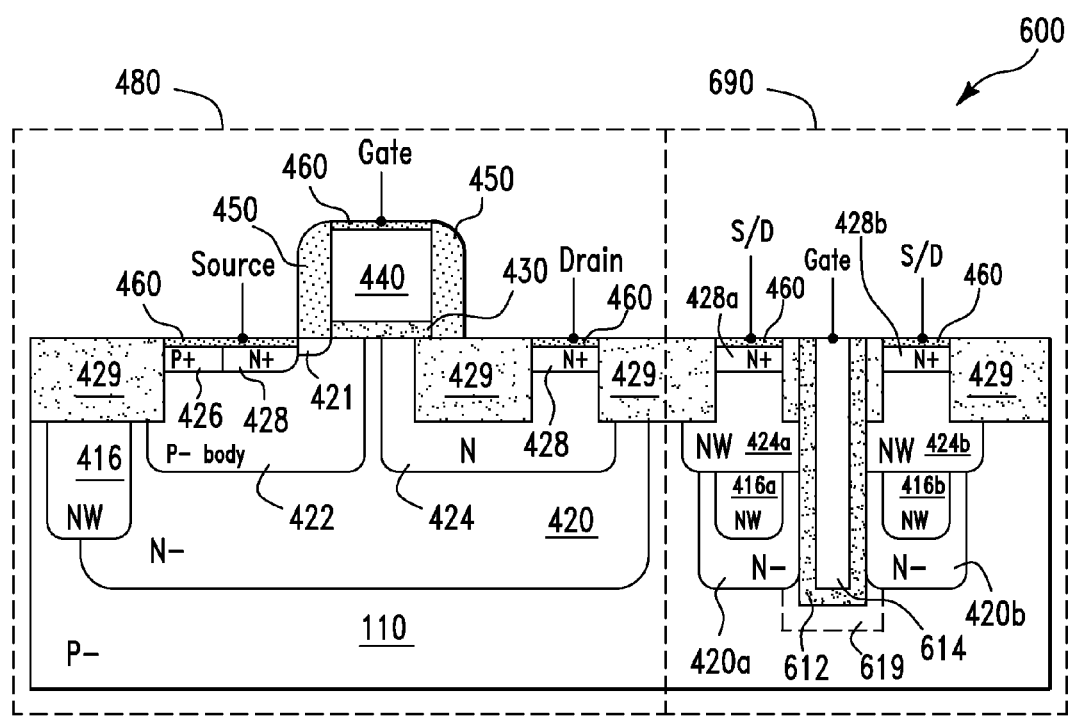
FIG. 6 shows a cross-section view of a sixth semiconductor structure, in accordance with embodiments of the present invention.

FIG. 6 shows a cross-section view of a semiconductor structure 600, in accordance with embodiments of the present invention. More specifically, the semiconductor structure 600 comprises the LDMOS transistor 480 and a lateral trench FET 690. The lateral trench FET 690 includes a channel region 619, a first Source/Drain region 420a+416a+424a+428a, a second Source/Drain region 420b+416b+424b+428b, a gate dielectric layer 612, and a gate electrode 614. In one embodiment, the first and second Source/Drain region 420a+416a+424a+428a and 420b+416b+424b+428b of the lateral trench FET 690 are formed using steps in the fabrication process of the LDMOS transistor 480. The formation of a trench isolation region 612+614 which serves as the gate dielectric layer 612 and the gate electrode 614 is similar to the formation of the trench isolation region 312+314 of FIG. 3B. More specifically, the trench isolation region 612+614 can be formed (i) after the first and second Source/Drain region 420a+416a+424a+428a and 420b+416b+424b+428b and the STI regions 429 are formed and (ii) before the gate dielectric 430, the gate electrode 440, the spacer regions 450, and the silicide regions 460 are formed.

In summary, the first and second Source/Drain regions of the lateral trench FETs 190, 290, and 390 of FIGS. 1H, 2D, and 3B are formed using steps in the fabrication processes for forming the LDMOS transistors 180 of FIGS. 1H, 2D, and 3B. The first and second Source/Drain regions of the lateral trench FETs 490, 590, and 690 of FIGS. 4-6 are formed using steps in the fabrication processes for forming the LDMOS transistors 480 of FIGS. 4-6. The lateral trench FETs 190, 290, 390, 490, 590, and 690 can serve as high voltage power devices that have breakdown voltages in the range from 120V to 150V.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor structure, comprising:
  a semiconductor structure which includes a semiconductor substrate, wherein a top substrate surface of the semiconductor substrate defines a reference direction perpendicular to the top substrate surface;
  a first doped transistor region of a first transistor and a first doped Source/Drain portion of a second transistor on the semiconductor substrate, wherein the first doped transistor region is not a portion of a Source/Drain region of the first transistor, and wherein the first doped transistor region and the first doped Source/Drain portion comprise dopants of a first doping polarity;
  a second gate dielectric layer and a second gate electrode region of the second transistor on the semiconductor substrate, wherein the second gate dielectric layer (i) is sandwiched between and (ii) electrically insulates the second gate electrode region and the semiconductor substrate;
  a first gate dielectric layer and a first gate electrode region of the first transistor on the semiconductor substrate, wherein the first gate dielectric layer (i) is sandwiched between and (ii) electrically insulates the first gate electrode region and the semiconductor substrate, wherein the first gate electrode region of the first transistor is on and totally above the top substrate surface, and wherein the second gate electrode region of the second transistor is on the semiconductor substrate and totally below the top substrate surface; and a second doped transistor region of the first transistor and a second doped Source/Drain portion of the second transistor on the semiconductor substrate, wherein the second doped transistor region and the second doped Source/Drain portion comprise dopants of the first doping polarity, and wherein the second doped Source/Drain portion is in direct physical contact with the first doped Source/Drain portion.

2. The semiconductor structure of claim 1, further comprising a third doped transistor region of the first transistor on the semiconductor substrate, wherein the third doped transistor region comprises dopants of a second doping polarity which is opposite to the first doping polarity.

3. The semiconductor structure of claim 1, wherein the second gate dielectric layer surrounds the second gate electrode region.

4. The semiconductor structure of claim 3, wherein the first doped Source/Drain portion is below the top substrate surface, and wherein the first doped Source/Drain portion is in direct physical contact with the second gate dielectric layer.

5. The semiconductor structure of claim 1, wherein the second gate dielectric layer surrounds the second gate electrode region, wherein the first doped Source/Drain portion is below the top substrate surface, wherein the first doped Source/Drain portion is in direct physical contact with the second gate dielectric layer, and wherein the second doped Source/Drain portion is in direct physical contact with the second gate dielectric layer.

6. The semiconductor structure of claim 5, wherein the second doped Source/Drain portion is disposed between the first doped Source/Drain portion and the top substrate surface.

7. The semiconductor structure of claim 1, wherein the first doped transistor region of the first transistor has a first depth in the reference direction, wherein the first doped Source/Drain portion of the second transistor has a second depth in the reference direction, and wherein the first depth is essentially equal to the second depth.

8. The semiconductor structure of claim 1, wherein the first doped Source/Drain portion of the second transistor has a second depth in the reference direction, wherein the second gate dielectric layer of the second transistor has a third depth in the reference direction, and wherein the third depth is greater than the second depth.

9. The semiconductor structure of claim 1, further comprising, a shallow trench isolation (STI) region on the semiconductor substrate, wherein the STI region is in direct physical contact with the second gate dielectric layer and the second gate electrode region.

10. The semiconductor structure of claim 1, wherein the first doped Source/Drain portion of the second transistor has a second depth in the reference direction, wherein the second gate dielectric layer of the second transistor has a fourth depth in the reference direction, and wherein the fourth depth is less than the second depth.

11. A semiconductor structure, comprising:
a semiconductor structure which includes a semiconductor substrate, wherein the semiconductor substrate includes a top substrate surface which defines a reference direction perpendicular to the top substrate surface;

a first doped transistor region of a first transistor and a first doped Source/Drain portion of a second transistor on the semiconductor substrate, wherein the first doped transistor region is not a portion of a Source/Drain region of the first transistor, and wherein the first doped transistor region and the first doped Source/Drain portion comprise dopants of a first doping polarity;

a second gate dielectric layer and a second gate electrode region of the second transistor on the semiconductor substrate, wherein the second gate dielectric layer (i) is sandwiched between and (ii) electrically insulates the second gate electrode region and the semiconductor substrate;

a second doped transistor region of the first transistor and a second doped Source/Drain portion of the second transistor on the semiconductor substrate, wherein the second doped transistor region and the second doped Source/Drain portion comprise dopants of the first doping polarity, and wherein the second doped Source/Drain portion is in direct physical contact with the first doped Source/Drain portion;

a third doped transistor region of the first transistor on the semiconductor substrate, wherein the third doped transistor region comprises dopants of a second doping polarity which is opposite to the first doping polarity; and a fourth doped transistor region of the first transistor and a fourth doped Source/Drain portion of the second transistor on the semiconductor substrate, wherein the fourth doped transistor region and the fourth doped Source/Drain portion comprise dopants of the first doping polarity, and wherein the fourth doped Source/Drain portion is in direct physical contact with the second doped Source/Drain portion.

12. The semiconductor structure of claim 11, further comprising a fifth doped transistor region of the first transistor and a fifth doped Source/Drain portion of the second transistor on the semiconductor substrate, wherein the fifth doped transistor region and the fifth doped Source/Drain portion comprise dopants of the first doping polarity, and wherein the fifth doped Source/Drain portion is in direct physical contact with the fourth doped Source/Drain portion.

13. A semiconductor structure fabrication method, comprising:
providing a semiconductor structure which includes a semiconductor substrate, wherein a top substrate surface of the semiconductor substrate defines a reference direction perpendicular to the top substrate surface;

simultaneously forming a first doped transistor region of a first transistor and a first doped Source/Drain portion of a second transistor on the semiconductor substrate, wherein the first doped transistor region is not a portion of a Source/Drain region of the first transistor, and wherein the first doped transistor region and the first doped Source/Drain portion comprise dopants of a first doping polarity;

forming a second gate dielectric layer and a second gate electrode region of the second transistor on the semiconductor substrate, wherein the second gate dielectric layer (i) is sandwiched between and (ii) electrically insulates the second gate electrode region and the semiconductor substrate;

forming a first gate dielectric layer and a first gate electrode region of the first transistor on the semiconductor substrate, wherein the first gate dielectric layer (i) is sandwiched between and (ii) electrically insulates the first gate electrode region and the semiconductor substrate, wherein the first gate electrode region of the first transistor is on and totally above the top substrate surface, and wherein the second gate electrode region of the second transistor is on the semiconductor substrate and totally below the top substrate surface; and simultaneously forming a second doped transistor region of the first transistor and a second doped Source/Drain portion of the second transistor on the semiconductor substrate, wherein the second doped transistor region and the second doped Source/Drain portion comprise dopants of the first doping polarity, and wherein the second doped Source/Drain portion is in direct physical contact with the first doped Source/Drain portion.

14. The method of claim 13, wherein the first doped transistor region of the first transistor has a first depth in the reference direction, wherein the first doped Source/Drain portion of the second transistor has a second depth in the reference direction, and wherein the first depth is essentially equal to the second depth.

15. The method of claim 13, further comprising forming a third doped transistor region of the first transistor on the semiconductor substrate, wherein the third doped transistor region comprises dopants of a second doping polarity which is opposite to the first doping polarity.

16. The method of claim 13, wherein said forming the second gate dielectric layer and the second gate electrode region is performed before said simultaneously forming the first doped transistor region and the first doped Source/Drain portion is performed.

17. The method of claim 16, wherein the first doped Source/Drain portion of the second transistor has a second depth in the reference direction, wherein the second gate dielectric layer of the second transistor has a third depth in the reference direction, and wherein the third depth is greater than the second depth.

18. The method of claim 13, wherein said forming the second gate dielectric layer and the second gate electrode region is performed after said simultaneously forming the first doped transistor region and the first doped Source/Drain portion is performed.

19. The method of claim 18, wherein the first doped Source/Drain portion of the second transistor has a second depth in the reference direction, wherein the second gate dielectric layer of the second transistor has a fourth depth in the reference direction, and wherein the fourth depth is less than the second depth.

20. The method of claim 13, wherein the second gate dielectric layer surrounds the second gate electrode region, wherein the first doped Source/Drain portion is below the top substrate surface, wherein the first doped Source/Drain portion is in direct physical contact with the second gate dielectric layer, and wherein the second doped Source/Drain portion is in direct physical contact with the second gate dielectric layer.

* * * * *